United States Patent
Harikrishna Mohan et al.

(10) Patent No.: US 9,876,192 B2
(45) Date of Patent: Jan. 23, 2018

(54) BARRIER COMPOSITION AND PROPERTIES

(71) Applicant: Universal Display Corporation, Ewing, NJ (US)

(72) Inventors: Siddharth Harikrishna Mohan, Plainsboro, NJ (US); William E. Quinn, Whitehouse Station, NJ (US)

(73) Assignee: Universal Display Corporation, Ewing, NJ (US)

(*) Notice: Subject to any disclaimer, the term of this patent is extended or adjusted under 35 U.S.C. 154(b) by 0 days.

(21) Appl. No.: 15/310,577

(22) PCT Filed: May 12, 2015

(86) PCT No.: PCT/US2015/030340
§ 371 (c)(1),
(2) Date: Nov. 11, 2016

(87) PCT Pub. No.: WO2015/175513
PCT Pub. Date: Nov. 19, 2015

(65) Prior Publication Data
US 2017/0077451 A1    Mar. 16, 2017

Related U.S. Application Data

(60) Provisional application No. 61/991,788, filed on May 12, 2014, provisional application No. 61/991,979, filed on May 12, 2014.

(51) Int. Cl.
*H01L 51/52* (2006.01)
*H01L 51/56* (2006.01)

(52) U.S. Cl.
CPC ...... *H01L 51/5253* (2013.01); *H01L 51/5246* (2013.01); *H01L 51/56* (2013.01)

(58) Field of Classification Search
CPC ................ H01L 51/107; H01L 51/448; H01L 51/5253–51/5259
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |

(Continued)

FOREIGN PATENT DOCUMENTS

| | | |
|---|---|---|
| WO | WO-2008057394 A1 | 5/2008 |
| WO | WO-2010011390 A2 | 1/2010 |

OTHER PUBLICATIONS

Lee et al., 'X-ray reflectivity and FTIR measurements of N2 plasma effects on the density profile of hydrogen silsesquioxane thin films,' Journal of the Electrochemical Society, vol. 148, No. 10, pp. F195-F199.*

(Continued)

*Primary Examiner* — Bryan Junge
(74) *Attorney, Agent, or Firm* — Morris & Kamlay LLP

(57) ABSTRACT

A barrier film on an organic electronic device. The barrier film comprises an inorganic polymeric silicon composition having Si—O—Si bonds which exhibit an asymmetric stretching Si-0 vibration frequency (AS1) ranging between 1200 $cm^{-1}$ and 1000 $cm^{-1}$, Si—O—H vibration frequency ranging between 950 $cm^{-1}$ and 810 $cm^{-1}$ and an —O—H ranging between 3400 $cm^{-1}$ and 3700 $cm^{-1}$ in which the ratio of peak areas for Si—O—H and —O—H vibration frequencies compared to the peak area of the Si—O—Si vibration frequency is less than 0.15. The barrier film exhibits a water vapor transmission rate between $1 \times 10^{-2}$ $g/m^{-2}$ day and $1 \times 10^{-8}$ $g/m^{-2}$ day.

20 Claims, 11 Drawing Sheets

(56) References Cited

U.S. PATENT DOCUMENTS

| | | | |
|---|---|---|---|
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 7,279,704 | B2 | 10/2007 | Walters et al. |
| 7,306,852 | B2 | 11/2007 | Komada |
| 7,431,968 | B1 | 10/2008 | Shtein et al. |
| 7,968,146 | B2 | 6/2011 | Wagner et al. |
| 8,057,869 | B2 | 11/2011 | Hokazono et al. |
| 2001/0038894 | A1* | 11/2001 | Komada ............... B32B 7/02 428/34.6 |
| 2003/0230980 | A1 | 12/2003 | Forrest et al. |
| 2004/0174116 | A1 | 9/2004 | Lu et al. |
| 2007/0048880 | A1* | 3/2007 | Kobayashi ............ B41J 2/161 438/3 |
| 2011/0171447 | A1* | 7/2011 | Krishnamoorthy .. C09D 183/04 428/220 |
| 2012/0225218 | A1* | 9/2012 | Savas ............... C23C 16/45574 427/576 |

OTHER PUBLICATIONS

Baldo, "Highly efficient phosphorescent emission from organic electroluminescent devices," Nature, vol. 395, pp. 151-154, 1998.

Baldo, "Very high-efficiency green organic light-emitting devices based on electrophosphorescence," Applied Physics Letters, vol. 75, No. 1, pp. 4-6, Jul. 5, 1999.

International Search Report and Written Opinion dated Aug. 5, 2015 as received in Application No. PCT/US2015/030340.

McMillan et al. Hydroxyl sites in SiO2 glass: A note on infrared and Raman spectra. American Mineralogist, 71 (5-6):772-778, 1986. entire document.

* cited by examiner

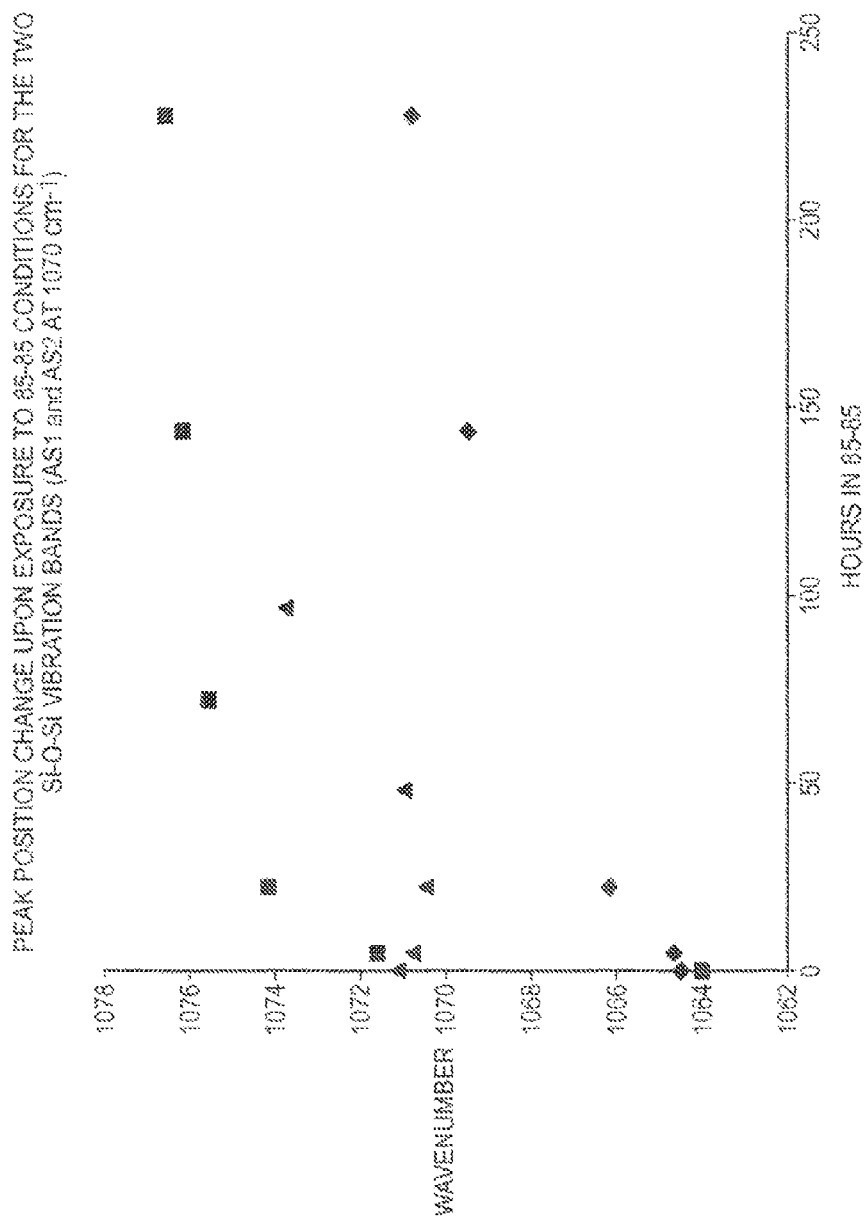

BARRIER COMPOSITION AND PROPERTIES

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to barrier films for electronic devices.

BACKGROUND OF THE INVENTION

Organic light-emitting devices (OLEDs) have many advantages over other display technologies. One of the advantages of OLEDs is the ability to fabricate them on flexible substrates. Other advantages of OLEDs include their efficient, emissive, solid-state nature and the absence of viewing-angle effects. However, many OLEDs on flexible substrates exhibit inadequate lifetimes due in part to lack of effective encapsulation of these OLEDs to preclude the ingression of water and oxygen. Accordingly, there is an urgent need in the field for effective protective barriers for OLEDs on polymer substrates to provide sufficient protection against the ingression of water and oxygen, thereby ensuring satisfactory lifetimes for these devices.

BRIEF SUMMARY OF THE INVENTION

In one aspect, the present invention provides a barrier film on an organic electronic device. In one embodiment, the barrier film comprises an inorganic polymeric silicon composition having Si—O—Si bonds which exhibit an asymmetric stretching Si—O vibration frequency (AS1) ranging between 1200 $cm^{-1}$ and 1000 $cm^{-1}$, Si—O—H vibration frequency ranging between 950 $cm^{-1}$ and 810 $cm^{-1}$ and an —O—H ranging between 3400 $cm^{-1}$ and 3700 $cm^{-1}$ in which the ratio of peak areas for Si—O—H and —O—H vibration frequencies compared to the peak area of the Si—O—Si vibration frequency is less than 0.15. In one embodiment, the barrier film comprises an inorganic polymeric silicon composition in which the barrier film exhibits a water vapor transmission rate between $1\times10^{-2}$ $g/m^{-2}$ day and $1\times10^{-8}$ $g/m^{-2}$ day.

In one embodiment, the barrier film comprises an inorganic polymeric silicon composition having Si—O—Si bonds which exhibit an asymmetric stretching Si—O vibration frequency (AS1) ranging between 1200 $cm^{-1}$ and 1000 $cm^{-1}$, Si—O—H vibration frequency ranging between 950 $cm^{-1}$ and 810 $cm^{-1}$ and an —O—H ranging between 3400 $cm^{-1}$ and 3700 $cm^{-1}$, wherein the ratio of peak areas for Si—O—H and —O—H vibration frequencies compared to the peak area of the Si—O—Si vibration frequency is less than 0.15 and, wherein the barrier film exhibits a water vapor transmission rate between $1\times10^{-2}$ $g/m^{-2}$ day and $1\times10^{-8}$ $g/m^{-2}$ day.

In one embodiment of the barrier film, the peak area of the Si—O—H vibration frequency ranging between 950 $cm^{-1}$ and 810 $cm^{-1}$ remains substantially constant following exposure to 85° C. and 85% relative humidity for up to 500 hours. In one embodiment of the barrier film, the barrier film exhibits a stress value which remains substantially constant following exposure to 85° C. and 85% relative humidity for up to 500 hours. In some embodiments, the stress is compressive stress. In other embodiments, the stress is tensile stress.

In one embodiment of the barrier film, the inorganic polymeric silicon composition is formed by plasma chemical vapor deposition. In one embodiment of the barrier film, the inorganic polymeric silicon layer is formed by plasma chemical vapor deposition using organosilicon precursors.

In another aspect, the present invention provides an organic electronic device comprising a barrier film of the present invention. In one embodiment, the device of the present invention includes a foundation and a functional organic body disposed over the foundation wherein a barrier film disposed over the functional organic body. In one embodiment of the device of the present invention, the barrier film comprises an inorganic polymeric silicon composition having Si—O—Si bonds which exhibit an asymmetric stretching Si—O vibration frequency (AS1) ranging between 1200 $cm^{-1}$ and 1000 $cm^{-1}$, Si—O—H vibration frequency ranging between 950 $cm^{-1}$ and 810 $cm^{-1}$ and an —O—H ranging between 3400 $cm^{-1}$ and 3700 $cm^{-1}$ in which the ratio of peak areas for Si—O—H and —O—H vibration frequencies compared to the peak area of the Si—O—Si vibration frequency is less than 0.15, wherein the barrier film exhibits a water vapor transmission rate between $1\times10^{-2}$ $g/m^{-2}$ day and $1\times10^{-8}$ $g/m^{-2}$ day.

In one embodiment of the device of the present invention, the device has an operating lifetime of greater than 500 hours at 85° C. and 85% relative humidity. In one embodiment of the device of the present invention, the peak area of the O—H vibration frequency ranging between 950 $cm^{-1}$ and 810 $cm^{-1}$ remains substantially constant following exposure to 85° C. and 85% relative humidity for 500 hours. In one embodiment of the device of the present invention, the barrier film exhibits a stress value which remains substantially constant following exposure to 85° C. and 85% relative humidity for 500 hours. In one embodiment of the device of the present invention, the barrier film has a thickness of 0.1 to 10 micron. In one embodiment of the device of the present invention, the inorganic polymeric silicon composition is formed by plasma chemical vapor deposition. In one embodiment of the device of the present invention, the inorganic polymeric silicon layer is formed by plasma chemical vapor deposition using organosilicon precursors.

In one embodiment of the device of the present invention, at least a portion of the barrier layer extends over an edge of the functional organic body and onto the foundation.

In some embodiments, the device of the present invention further includes a flexible foundation.

In some embodiments, the device of the present invention further includes a second barrier film disposed under the functional organic body.

In one embodiment of the device of the present invention, further comprising an intervening layer disposed between the surface of the foundation and the barrier layer, the intervening layer comprising a material that serves to increase the interfacial cohesion between the foundation surface and the barrier layer. In one embodiment of the device of the present invention, the intervening layer comprises an inorganic material. In one embodiment of the device of the present invention, the intervening layer is a metal including Cr, Au, Ti and combinations thereof. In one embodiment of the device of the present invention, the intervening layer is a transparent material including, a metal oxide, a metal nitride, a metal oxynitride, a metal carbide, a metal oxyboride and combinations thereof. In one such embodiment, the metal oxide includes silicon oxide, aluminum oxide, titanium oxide, indium oxide, tin oxide, zinc oxide, indium tin oxide, indium zinc oxide, aluminum zinc oxide, tantalum oxide, zirconium oxide, niobium oxide, molybdenum oxide and combinations thereof. In another such embodiment, metal nitrides include silicon nitride, titanium nitride, aluminum nitride, boron nitride and combinations thereof. In still another such embodiment, metal oxynitrides include titanium oxynitride, aluminum oxynitride, silicon oxynitride, boron oxynitride and combinations thereof. In still yet another such embodiment, metal carbides include titanium carbide tungsten carbide, boron carbide, silicon carbide and combinations thereof. In still yet another such embodiment, metal oxyborides include zirconium oxyboride, titanium oxyboride and combinations thereof. In one embodiment of the device of the present invention, the device includes an intervening layer disposed between the surface of the foundation and the barrier layer, the intervening layer comprising an inorganic material which comprises chromium or silicon nitride.

In one embodiment of the device of the present invention, the device further comprises an edge barrier at one or more areas peripherally adjacent the functional organic body. In one such embodiment of the device of the present invention, the edge barrier comprises end caps surrounding the edges of the functional organic body. In one such embodiment, the edge barrier comprises adhesive bonds between the barrier film and the foundation surface.

In some embodiments of the device of the present invention, the device includes a foundation that is a substrate. In some embodiments of the device of the present invention, further comprise a substrate, wherein the foundation is a planarizing layer on the substrate. In some embodiments of the device of the present invention, wherein the foundation is a planarizing layer on a substrate, wherein the planarizing layer comprises a mixture of a polymeric material and a non-polymeric material. In some embodiments of the device of the present invention, the functional organic body is encapsulated by the barrier film and a planarizing layer.

BRIEF DESCRIPTION OF THE DRAWINGS

The foregoing summary, as well as the following detailed description of embodiments of the barrier film and the organic electroluminescent devices of the present invention, will be better understood when read in conjunction with the appended drawings of exemplary embodiments. It should be understood, however, that the invention is not limited to the precise arrangements and instrumentalities shown.

In the drawings:

FIG. 5a shows peak position change upon exposure to 85-85 conditions for the two Si—O—Si vibration bands, AS1 and AS2 at 1070 $cm^{-1}$ and 1170 $cm^{-1}$;

DETAILED DESCRIPTION OF THE INVENTION

Figure 1A:
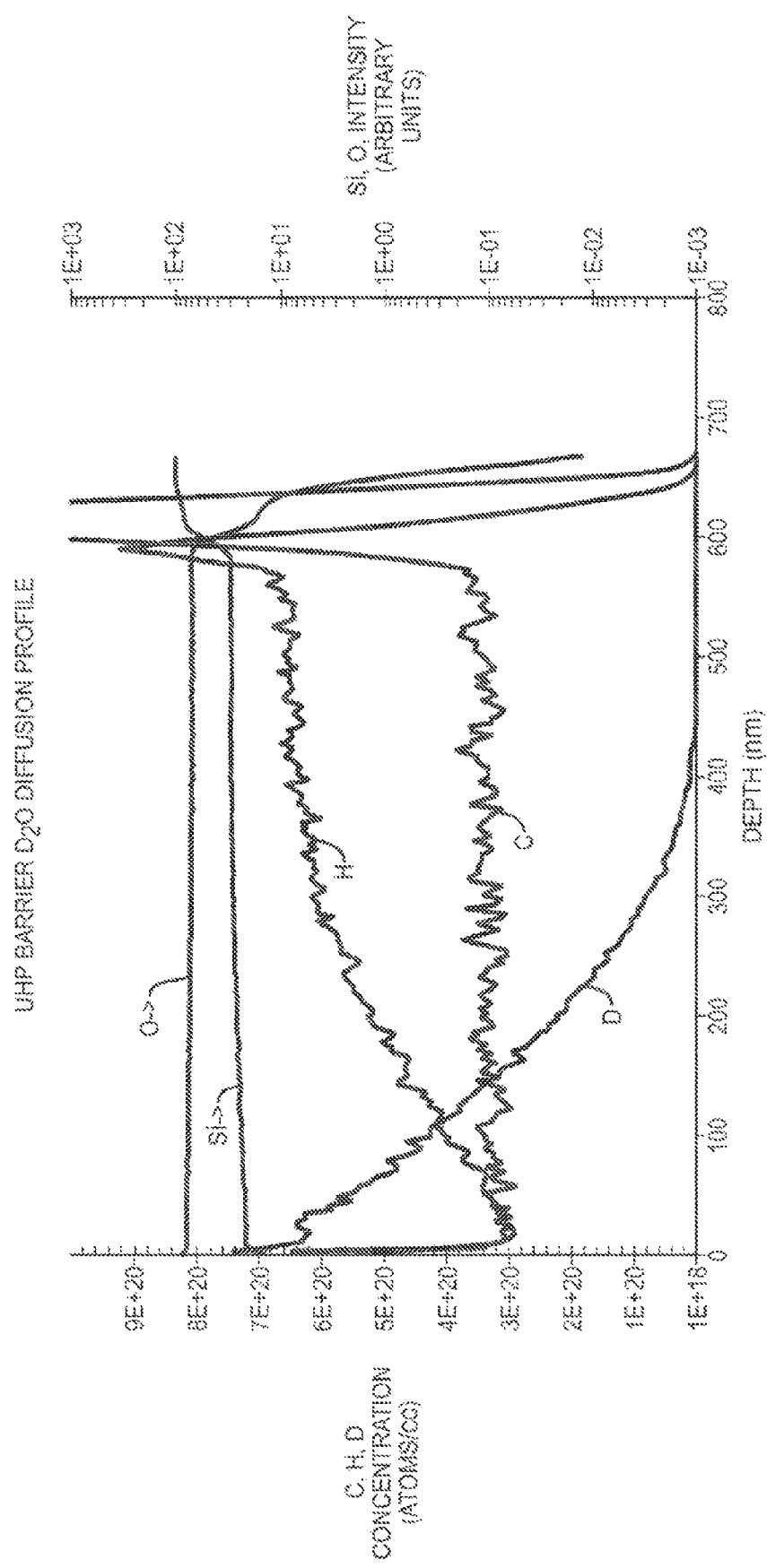
FIG. 1a shows ultra-high performance (UHP) barrier $D_2O$ diffusion profile of an exemplary embodiment of a barrier film of the present invention.

Scientific and technical terms used herein are intended to have the meanings commonly understood by those of ordinary skill in the art.

Water vapor transmission rate (WVTR) as used herein refers to a steady state rate at which water vapor permeates through a film at test conditions of 38° C. and 90% relative humidity. Values of WVTR may be expressed in g/100 $in^2$/24 hr (in US standard units) and/or $g/m^2$/24 hr (or day) in metric (or SI) units.

In one aspect, the present invention provides a barrier film on an organic electronic device. In one embodiment, the barrier film comprises an inorganic polymeric silicon composition having Si—O—Si bonds which exhibit an asymmetric stretching Si—O vibration frequency (AS1) ranging between 1200 $cm^{-1}$ and 1000 $cm^{-1}$, Si—O—H vibration frequency ranging between 950 $cm^{-1}$ and 810 $cm^{-1}$ and an —O—H vibration frequency ranging between 3400 $cm^{-1}$ and 3700 $cm^{-1}$ in which the ratio of peak areas for Si—O—H and —O—H vibration frequencies compared to the peak area of the Si—O—Si vibration frequency is less than 0.15. In one embodiment, the barrier film comprises an inorganic polymeric silicon composition in which the barrier film exhibits a water vapor transmission rate ranging between $1\times10^{-2}$ $g/m^{-2}$ day and $1\times10^{-8}$ $g/m^{-2}$ day; or $1\times10^{-3}$; $g/m^{-2}$ day and $1\times10^{-7}$ $g/m^{-2}$ day; $1\times10^{-4}$ $g/m^{-2}$ day and $1\times10^{-7}$ $g/m^{-2}$ day; or $1\times10^{-5}$ $g/m^{-2}$ day and $1\times10^{-6}$ $g/m^{-2}$ day The Si—O—Si asymmetric stretching Si—O vibration frequency range, the Si—O—H vibration frequency range and the —O—H vibration frequency range may each vary. In some embodiments, the Si—O—Si asymmetric stretching Si—O vibration frequency range may vary as 1200 $cm^{-1}$ and 1000 $cm^{-1}$; 1100 $cm^{-1}$ and 1050 $cm^{-1}$; 1090 $cm^{-1}$ and 1050 $cm^{-1}$ and 1075 $cm^{-1}$ and 1050 $cm^{-1}$. For each of the foregoing embodiments of the Si—O—Si asymmetric stretching Si—O vibration frequency ranges, the Si—O—H vibration frequency range may also vary as 950 cm$^{-1}$ and 810 cm$^{-1}$; 950 cm$^{-1}$ and 850 cm$^{-1}$; and 950 cm$^{-1}$ and 900 cm$^{-1}$. For each of the foregoing embodiments of the Si—O—Si asymmetric stretching Si—O vibration frequency ranges and Si—O—H vibration frequency ranges, the —O—H vibration frequency may vary as 3400 cm$^{-1}$ and 3700 cm$^{-1}$; 3500 cm$^{-1}$ and 3700 cm$^{-1}$; and 3500 cm$^{-1}$ and 3600 cm$^{-1}$. For each of the foregoing embodiments of the Si—O—Si asymmetric stretching Si—O vibration frequency ranges, Si—O—H vibration frequency ranges, and the —O—H vibration frequency ranges, the ratio of peak areas for Si—O—H and —O—H vibration frequencies compared to the peak area of the Si—O—Si vibration frequency may vary as less than 0.25; 0.2 and 0.15 or ranges between 0.25 to 0.02; 0.2 to 0.02; 0.15 to 0.01.

In one embodiment of the barrier film, the peak area of the Si—O—H vibration frequency ranging between 950 cm$^{-1}$ and 810 cm$^{-1}$ remains substantially constant following exposure to 85° C. and 85% relative humidity for up to 500 hours.

The term remains substantially constant as used herein with respect to the peak area of the Si—O—H vibration frequency means that any percentage change in the peak area of the Si—O—H vibration frequency did not exceed 20% when the barrier film was exposed to 85° C. and 85% relative humidity for up to 500 hours.

In one embodiment of the barrier film, a 1 micron thick barrier film exhibits a stress value which remains substantially constant following exposure to 85° C. and 85% relative humidity for up to 500 hours. In some embodiments, the stress is compressive stress. In other embodiments, the stress is tensile stress.

The term remains substantially constant as used herein with respect to the compressive stress value of the barrier film of the present invention means that any change in the compressive stress value and/or tensile stress was less than 50 mPa following exposure of the barrier film to 85° C. and 85% relative humidity for up to 500 hours.

In one embodiment of the barrier film, the inorganic polymeric silicon composition is formed by plasma chemical vapor deposition. In one embodiment of the barrier film, the inorganic polymeric silicon layer is formed by plasma chemical vapor deposition using organosilicon precursors. In such embodiments, the barrier film may have a thickness of 0.1 to 10 micron. In other such embodiments, the barrier film may have a thickness of 0.1 to 1.0 micron.

Various precursor materials are suitable for use in the present invention and are chosen for their various characteristics. For example, organo-silicon compounds, such as siloxanes, are a class of compounds suitable for use as the precursor material. Representative examples of siloxane compounds include hexamethyl disiloxane (HMDSO), dimethyl siloxane (DMSO) and tetraethyl orthosilicate (TEOS). Other organo-silicon compounds suitable for use as a precursor material include methylsilane; dimethylsilane; vinyl trimethylsilane; trimethylsilane; tetramethylsilane; ethylsilane; disilanomethane; bis(methylsilano)methane; 1,2-disilanoethane; 1,2-bis(methylsilano)ethane; 2,2-disilanopropane; 1,3,5-trisilano-2,4,6-trimethylene, and fluorinated derivatives of these compounds. Phenyl-containing organo-silicon compounds suitable for use as a precursor material include: dimethylphenylsilane and diphenylmethylsilane. Oxygen-containing organo-silicon compounds suitable for use as a precursor material include: dimethyldimethoxysilane; 1,3,5,7-tetramethylcyclotetrasiloxane; 1,3-dimethyldisiloxane; 1,1,3,3-tetramethyldisiloxane; 1,3-bis(silanomethylene)disiloxane; bis(1-methyldisiloxanyl)methane; 2,2-bis(1-methyldisiloxanyl)propane; 2,4,6,8-tetramethylcyclotetrasiloxane; octamethylcyclotetrasiloxane; 2,4,6,8,10-pentamethylcyclopentasiloxane; 1,3,5,7-tetrasilano-2,6-dioxy-4,8-dimethylene; hexamethylcyclotrisiloxane; 1,3,5,7,9-pentamethylcyclopentasiloxane; hexamethoxydisiloxane, and fluorinated derivatives of these compounds. Nitrogen-containing organo-silicon compounds suitable for use as a precursor material include: hexamethyldisilazane; divinyltetramethyldisilizane; hexamethylcyclotrisilazane; dimethylbis(N-methylacetamido)silane; dimethylbis-(N-ethyl acetamido) silane; methylvinylbis(N-methylacetamido)silane; methylvinylbis(N-butylacetamido)silane; methyltris(N-phenylacetamido)silane; vinyltris(N-ethylacetamido)silane; tetrakis(N-methylacetamido)silane; diphenylbis(diethylaminoxy)silane; methyltris(diethylaminoxy)si lane; and bis(trimethylsilyl)carbodiimide.

Referring to the drawings in detail, wherein like reference numerals indicate like elements throughout, there are shown in FIG. 1a-6 properties and performance characteristics of exemplary barrier films in accordance with the present invention. In FIG. 1a, for example, an ultra high performance (UHP) barrier D$_2$O diffusion profile of an exemplary embodiment of the barrier film of the present invention is shown. In order to determine the diffusivity of water in SiO$_2$-like barrier films, exemplary films in accordance with the present invention were exposed to D$_2$O (heavy water) at 101° C. and 100% relative humidity for a period of 12 hours. The exposed exemplary barrier films were quenched and subsequently analyzed by Secondary Ion Mass Spectrometry (SIMS) to obtain the profile of deuterium concentration in the barrier films. The depth profile was obtained by ion bombardment of the surface, which controllably sputters (removes) material from the film. Chemical analysis was performed by mass spectrometry analysis of sputtered-away particles. The mass spectrum reflects the film composition as a function of depth from its original surface. The mass spectrum in function of depth from the surface is a concentration profile. The absolute value of concentration of an element is determined by calibrating the ion intensity of the element on a compositional standard with known concentration, in the present case against hydrogen and deuterium ion implanted into thermally oxidized silicon dioxide layers. The diffusion coefficient (D) can be extracted from the concentration profile. If the diffusion length L=$\sqrt{D \cdot t}$<<T the diffusion profile c(x,t) follows a complementary error function distribution where c(0) being the constant surface concentration determined by the temperature and the humidity $$c(x, t) = c(0)\mathrm{erfc}\left(\frac{x}{\sqrt{Dt}}\right)$$

where 't' is the time and 'x' is the depth.

The permeability P of a gas (water vapor in this case) through a single barrier is defined as P=D·S, where S (g/cm$^3$·atm) is the solubility of gas (water vapor) in the barrier material and D is the diffusion co-efficient of the gas in the barrier material. The steady state flux per unit area (F) of water across the barrier film is P=Fl/ΔP, where '1' is the thickness of the barrier film and ΔP is the pressure gradient across the barrier film; which is the partial pressure of water vapor as it assumed that water completely reacts when it reaches the OLED. The steady state flux per unit area is the water vapor transmission rate (WVTR) across the barrier film. Thus, it is clear that for fixed conditions of partial pressure and solubility, the WVTR and diffusion co-efficient are directly related. The lower the diffusion co-efficient of water vapor in the film, the lower is the WVTR. When a film with lower water vapor diffusion co-efficient is used to protect an OLED, a longer lifetime can be expected when compared to a film with a higher diffusivity.

Figure 1B:
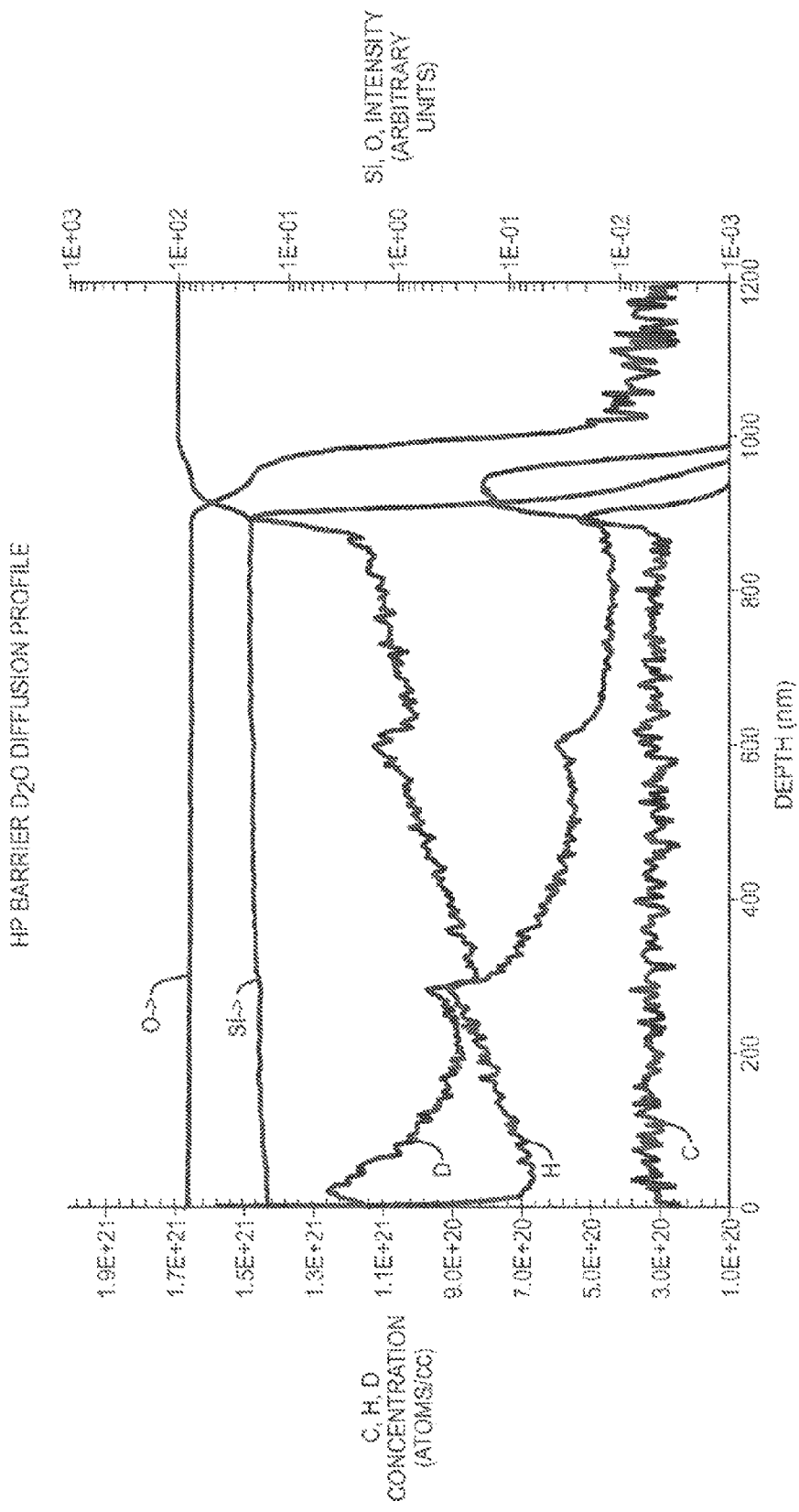
FIG. 1b shows high performance (HP) barrier $D_2O$ diffusion profile of an exemplary embodiment of a barrier film of the present invention.
Figure 1C:
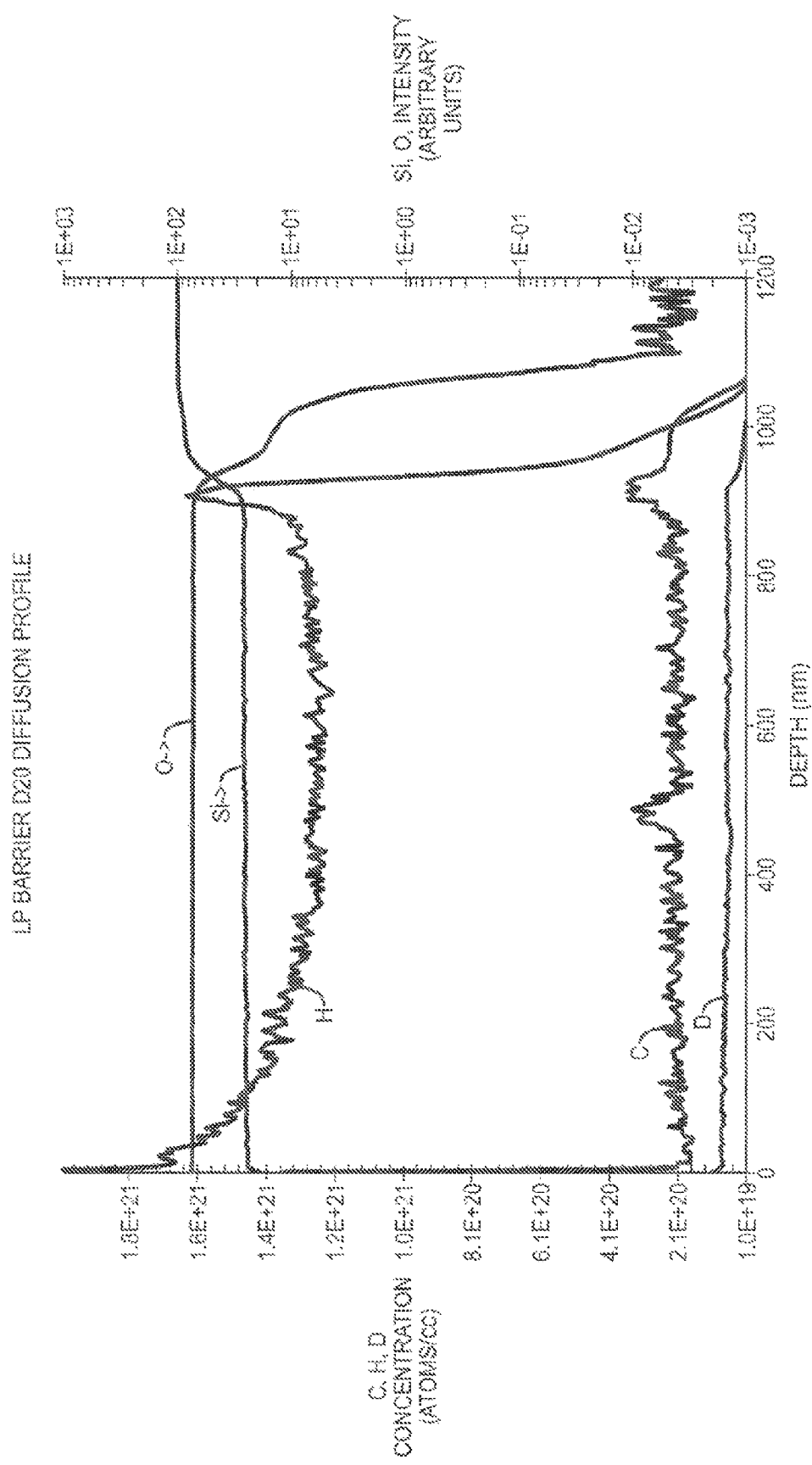
FIG. 1c shows low performance (LP) barrier $D_2O$ diffusion profile of an exemplary embodiment of a barrier film of the present invention.

FIGS. 1a, 1b and 1c show SIMS depth profiles of C, D and H after ageing of barrier films in $D_2O$ at 101° C. and 100% relative humidity. Thus, FIG. 1a-1c show the concentration of deuterium as a function of distance from the surface of the exemplary barrier films due to exposure to $D_2O$ under the stated conditions of temperature and relative humidity. The exposure times for the UHP, HP and LP barrier films were 12 hours, 0.3 hours and 0.03 hours respectively. FIGS. 1a and 1b show that as the concentration of deuterium (D) increases in the barrier film, the concentration of hydrogen (H) is reduced from the bulk value. The loss of hydrogen is proportional to the concentration of D in the barrier film, and hydrogen concentration is stable deep in the barrier film where there is no D diffusion. The profile for both D (in-diffusion) and H (out-diffusion) both follow a complementary error function distribution with an estimated diffusion coefficient for $D_2O$ in-diffusion of $4.2 \times 10^{-15}$ $cm^2/s$ and $2 \times 10^{-13}$ $cm^2/s$ respectively for UHP and HP barrier films respectively.

FIG. 1c is for a low performance barrier film and the depicted profile shows that the $D_2O$ has completely penetrated the barrier film and the concentration of deuterium is uniform throughout the barrier film. The diffusion co-efficient is too high to be estimated by this method.

Barrier films deposited using plasma deposition parameters which resulted in barrier films with higher hydrogen concentration show that the diffusion rate of $D_2O$ is higher in barrier films with higher concentrations of hydrogen. The diffusion rate for the barrier film shown in FIG. 1a is lower than for that for the barrier film in shown FIG. 1b. The hydrogen concentration in each barrier film is $6 \times 10^{20}$ $cm^{-3}$ and $1.3 \times 10^{21}$ $cm^{-3}$ respectively. Hydrogen is a byproduct of deposition process and comes from the (C—H) groups of the precursor. It is incorporated in the barrier film as C—H, O—H or Si—H, and appears to be an important component in determining the performance of barrier films.

In addition to hydrogen content, carbon content of the barrier films can predict performance of a barrier film (see: A. M. Coclite et al. *Surface and Coatings Technology* 2012, 4012-4017). A. M. Coclite et al. demonstrated that the presence of carbon in the films deteriorated barrier performance (the comparison was for carbon only, no other factors were considered for this comparison). The barrier films of the present invention show the opposite trend; the barrier film with the highest carbon content is the best barrier, although the level of carbon content is low in our films ($1 \times 10^{20}$ $cm^{-3}$ to $5 \times 10^{20}$ $cm^{-3}$). The barrier films prepared by A. M. Coclite et al. used a number of precursors, and the differences in carbon content may have been due to the precursors used. Deposition conditions were designed to give carbon free films with stoichiometry close to $SiO_2$ and did not optimize conditions to produce equivalent barrier properties. In contrast, in the presently disclosed barrier films applicants used a single precursor and have optimized the deposition parameters to give high quality barriers.

Figure 2A:
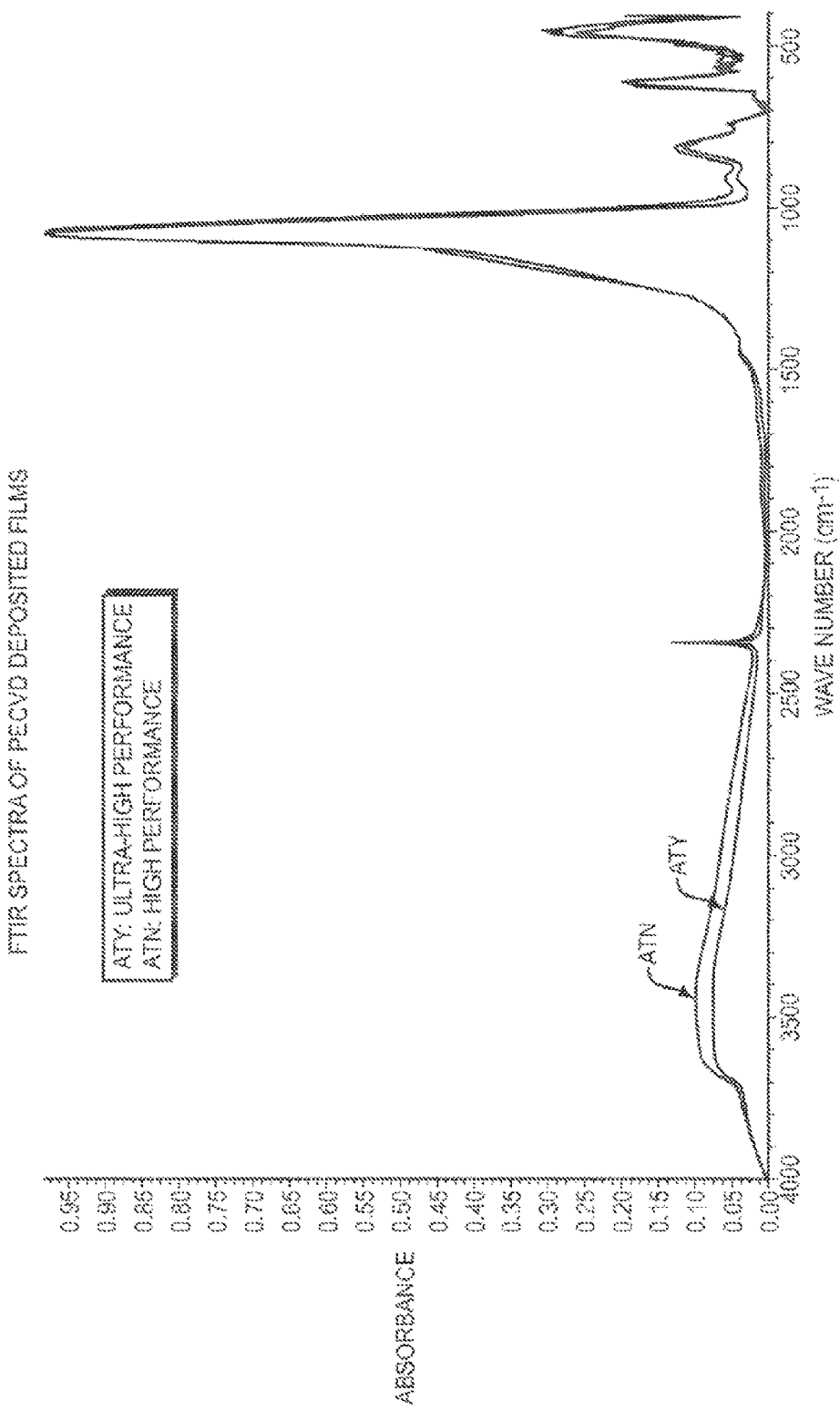
FIG. 2a shows Fourier transform infrared spectroscopy (FTIR) spectra of plasma enhanced chemical vapor deposition (PECVD) deposited ultra-high performance (ATY) and high performance (ATN) barrier films in accordance with exemplary embodiments of a barrier film of the present invention.
Figure 2B:
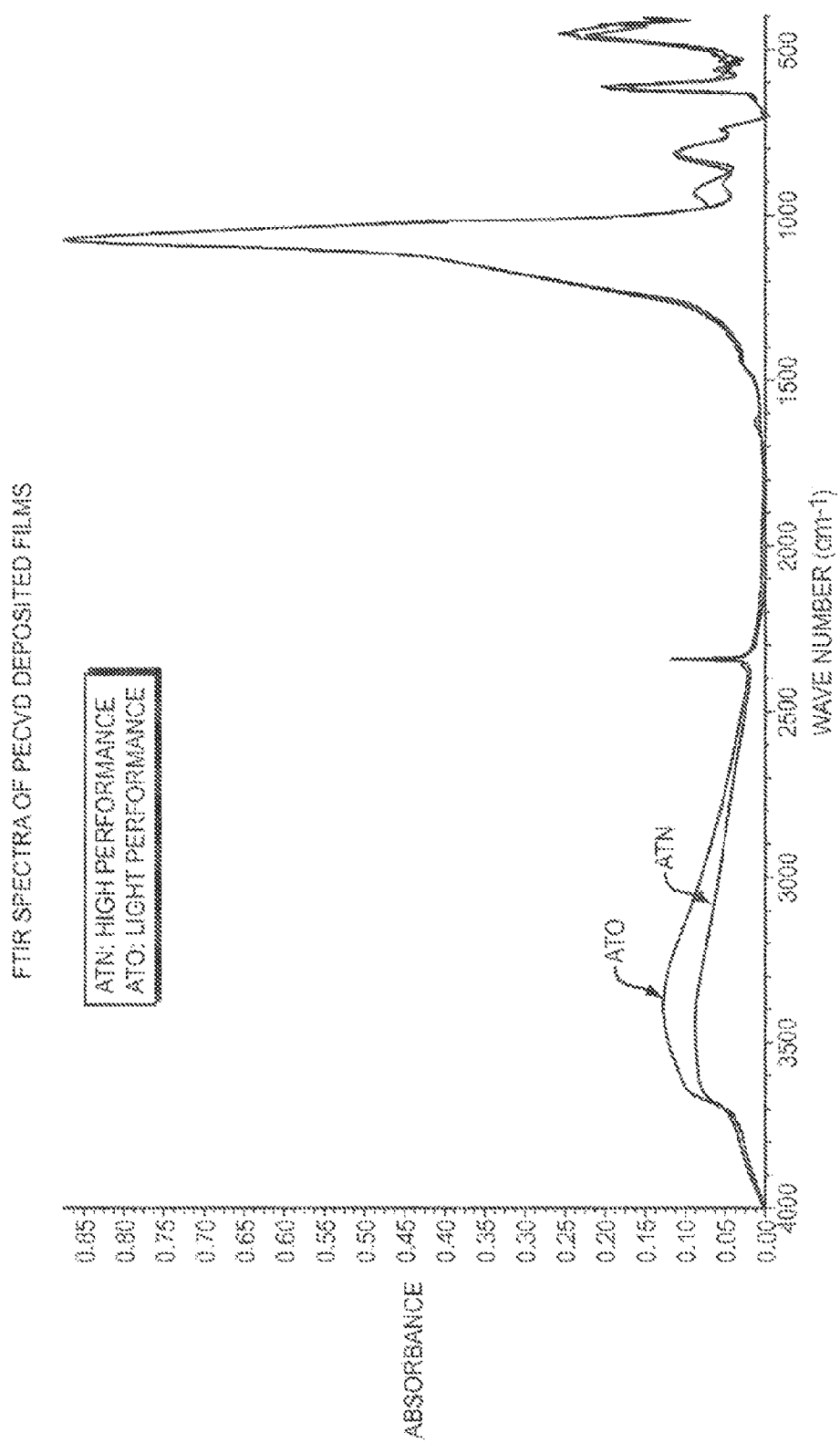
FIG. 2b shows FTIR spectra of PECVD deposited high performance (ATN) and low performance (ATO) barrier films in accordance with exemplary embodiments of a barrier film of the present invention.

Referring to the drawing FIGS. 2a and 2b, there are shown FTIR spectra of PECVD deposited barrier films in accordance with exemplary embodiments of the present invention. FIGS. 2a and 2b show spectra for $SiO_2$-like films with low barrier performance (AUO), high barrier performance (ATN), and (ATY) ultra-high barrier performance. As shown in FIGS. 2a and 2b, the depicted spectra contain information about the molecular vibration modes of atom pairs in the analyzed barrier films in the region from 600 $cm^{-1}$ to 4000 $cm^{-1}$. The spectral peaks, in the region from 600 $cm^{-1}$ to 4000 $cm^{-1}$, may be correlated to barrier film properties. For example, barrier performance can be correlated to shifts in the Si—O—Si infrared band absorption peaks and barrier film density. The Si—O—Si absorption band in the range of 1000 $cm^{-1}$ to 1200 $cm^{-1}$ consists of a broad doublet composed of AS1 and AS2 modes. The AS1 mode is correlated to film density; lower AS1 wave numbers correlate to denser films. AS2 mode is associated with film porosity; higher AS2 wave number is associated with a more porous structure. In a study of barrier films by Coclite, WVTR values for films deposited from different precursors were measured and the authors concluded that films with lower AS1 and AS2 peak positions were better barriers. However, these films were optimized from low carbon content not barrier properties. For films with optimized barrier properties, such as WVTR, it was unexpectedly found that films with higher AS1 and AS2 peak positions were better barriers.

Barrier films deposited from organo-silicon precursors by PECVD typically exhibit compressive stress. The level of stress can be modified by changing the deposition conditions, such as precursor to oxygen ratio, plasma power and bias, pressure, and the like. Stress is an important film parameter because films with high compressive stress may delaminate from an organic electroluminescent device. Accordingly, stress aging test can be used to determine film performance under specific stress conditions. Upon ageing in high temperature—high humidity conditions, barrier films may exhibit stress changes as a function of exposure time. Films with good water vapor resistance show little change in stress over extended periods of exposure. However, films with poor water vapor resistance show substantial stress change.

Figure 3:
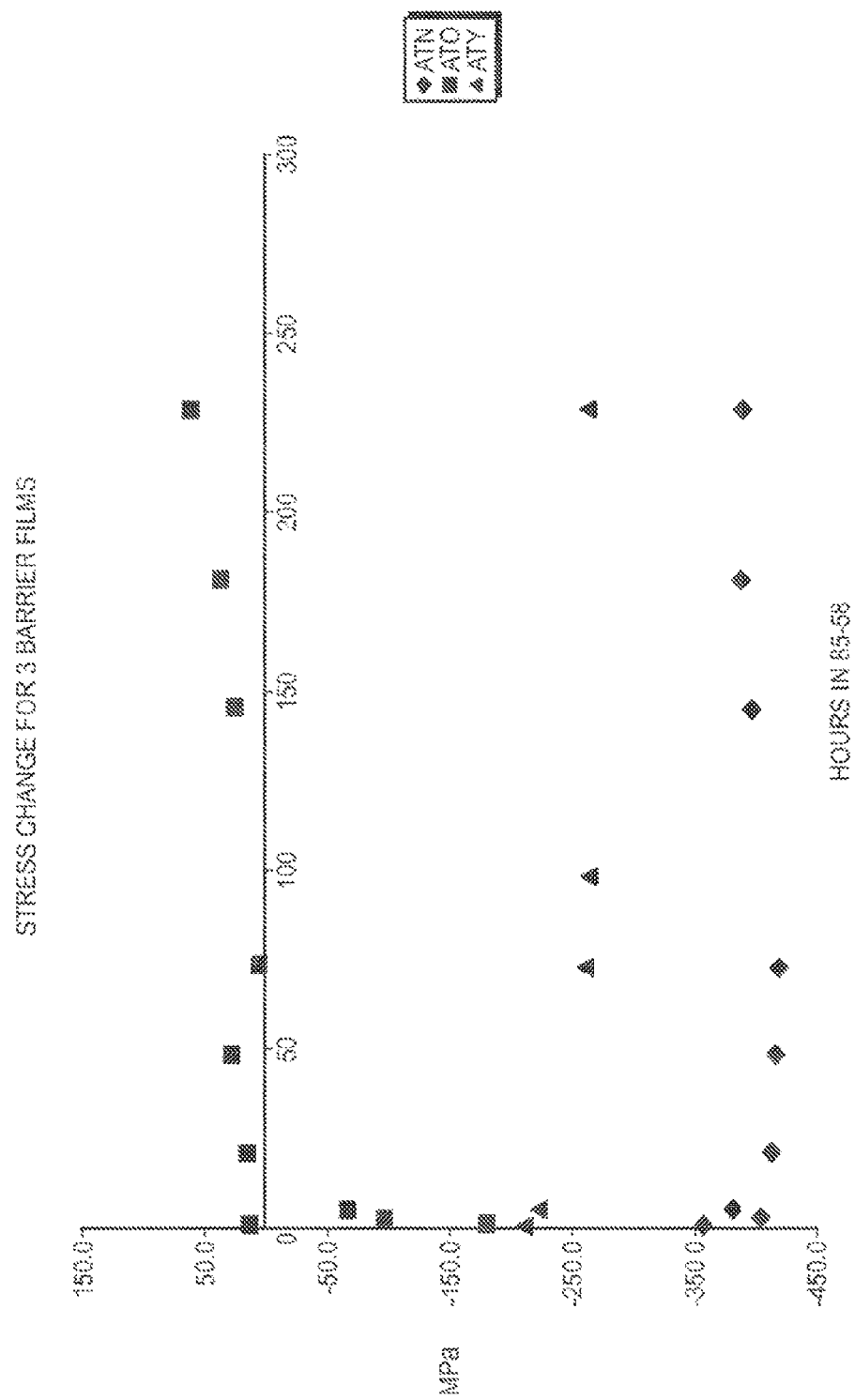
FIG. 3 shows stress change for three exemplary barrier films in accordance with the present invention.

Referring to FIG. 3 there is shown stress ageing effects for exemplary films prepared using different deposition parameters as shown in the following Table 1.

TABLE 1

| | | Deposition parameters and initial film characterization | | | | | |
|---|---|---|---|---|---|---|---|
| Sample | Barrier Performance | Plasma Power (W) | Plasma Etch Rate Ratio | Film Stress (Mpa) | 1070 $cm^{-1}$ Peak Position | 1170 $cm^{-1}$ Peak Position | Peak area Ratio of —OH to Si—O |
| ATO | Low | 150 | 1.87 | 13 | 1063.9 | 1158.0 | 0.337 |
| ATN | High | 250 | 1.34 | −355 | 1064.6 | 1164.0 | 0.176 |
| ATY | Ultra-high | 325 | 1.36 | −210 | 1071.2 | 1171.3 | 0.149 |

The above-noted films were characterized after deposition by spectroscopic ellipsometry (SE), plasma etch rate ratio (PERR), stress and FTIR. Results of the measurements are also given in Table 1. Film ATY has good barrier properties, and shows a small, slow change in stress. Film ATN exhibits a rapid increase in compressive stress, followed by a slow reduction in stress. Film ATO is a poor barrier and shows a very rapid increase in compressive stress within one half hour of exposure, followed by a rapid decrease in compressive stress and quickly becomes tensile. Films ATN and ATO will continue to become more tensile over time. Thus, film ATO is a low performance barrier that exhibits rapid change in stress, films ATN and ATY have good barrier performance and show minimal stress change.

In addition to changes in film stress upon high temperature-high humidity exposure, changes in film chemistry can be observed by FTIR analysis. In this regard, two specific absorbance bands were monitored during ageing; the Si—O adsorption bands AS1 and AS2 in the 1000 $cm^{-1}$ to 1200 $cm^{-1}$ range and the Si—OH band near 920 $cm^{-1}$. The unassociated O—H band near 3600 $cm^{-1}$ was also monitored. The three films used for the stress ageing study were also used for this study.

Figure 4A:
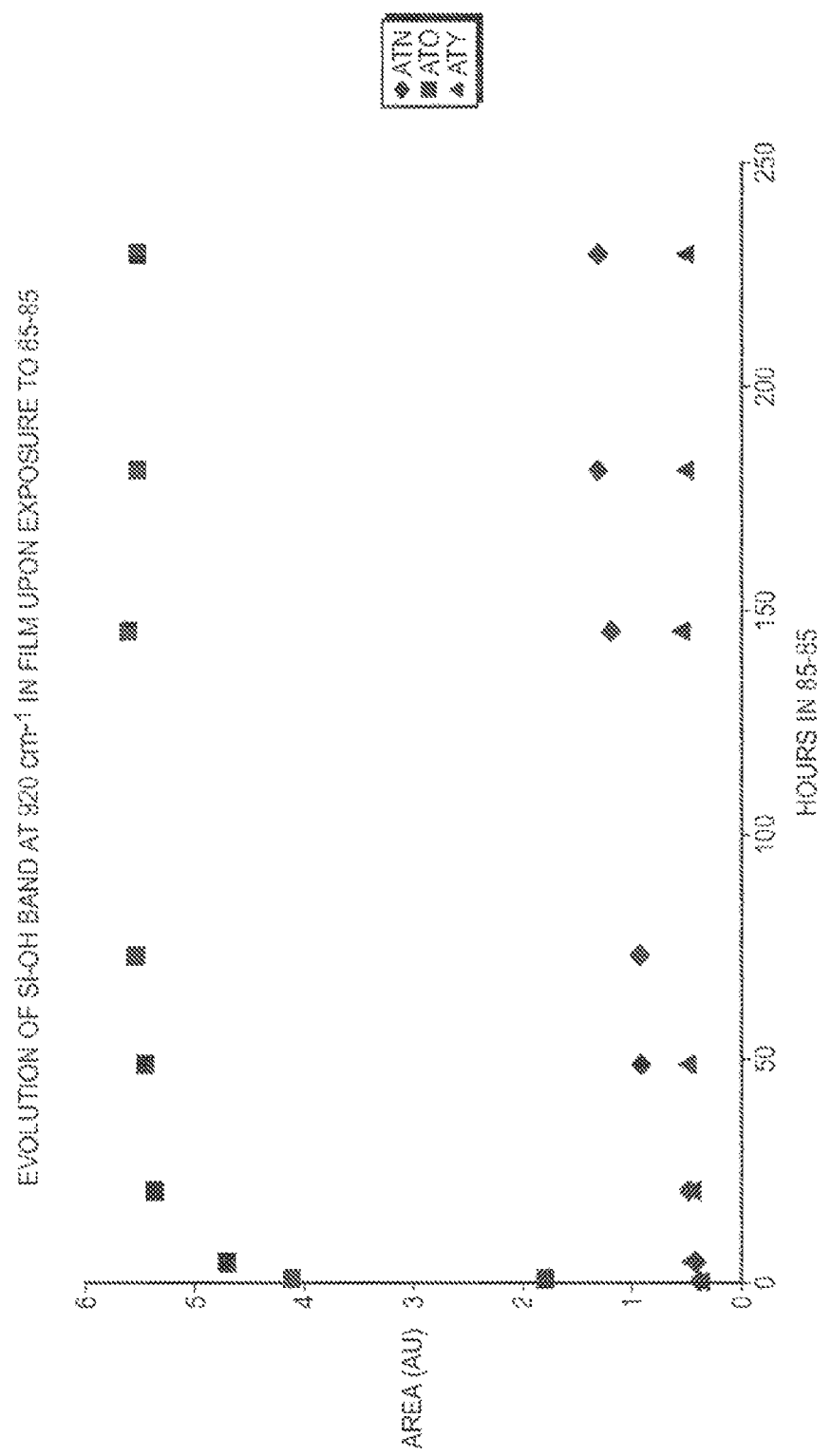
FIG. 4a shows evolution of Si—OH band at 920 $cm^{-1}$ in an exemplary barrier film of the present invention upon exposure to 85-85 conditions.
Figure 4B:
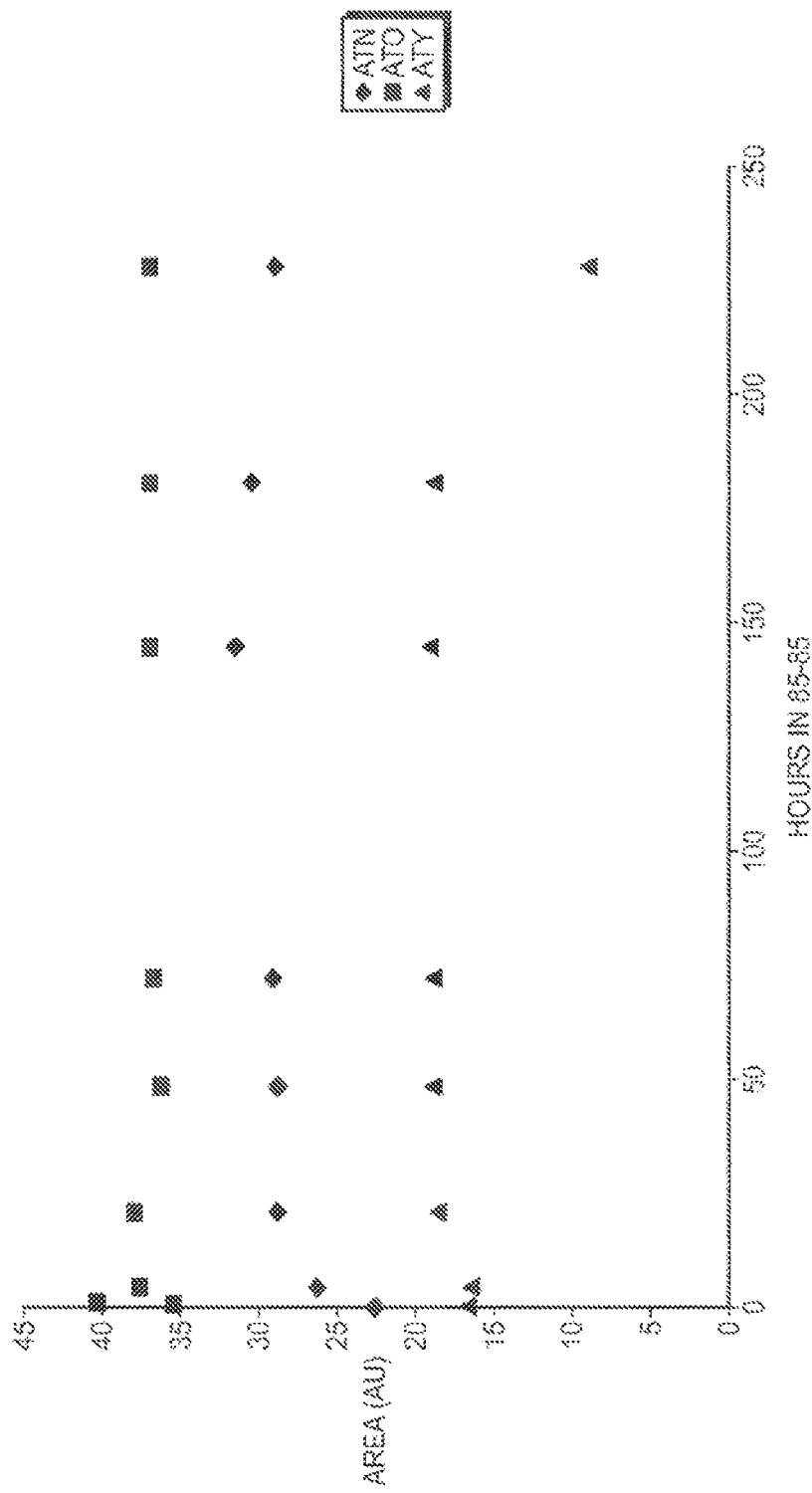
FIG. 4b shows evolution of -OH band at 3600 $cm^{-1}$ band in an exemplary barrier film of the present invention upon exposure to 85-85 conditions.

Referring to FIGS. 4a and 4b, there is shown normalized area of the OH absorption bands at 3600 $cm^{-1}$ and 920 $cm^{-1}$. The band at 3600 $cm^{-1}$ is attributed to adsorption of water by the film. Film ATY (Ultra-High performance barrier) shows stability in both stress and FTIR. The source of water can be from the high temperature high humidity (HTHH) exposure or as a byproduct of the deposition process ($O_2$+ $CH_3$). Film ATO, the low performance barrier, shows higher quantities of both Si—OH and —OH in the film. The peak at 920 $cm^{-1}$ shows a rapid increase in area after only one half hour exposure to 85-85 conditions. The stress shows a similar rapid change in the same time period. Films ATN and ATY have much lower —OH and Si—OH peak area, and show much more stable behavior upon exposure to 85-85. The peaks in the 1000 $cm^{-1}$ to 1200 $cm^{-1}$ range are attributed to Si—O—Si vibrations and appear as a main peak around 1060 $cm^{-1}$ and a shoulder near 1160 $cm^{-1}$. The two peaks were resolved using a Gaussian fit of the as measured spectra (Thermo-Fisher FTIR OMNIC software, Thermo Fisher Scientific Inc.).

Figure 5B:
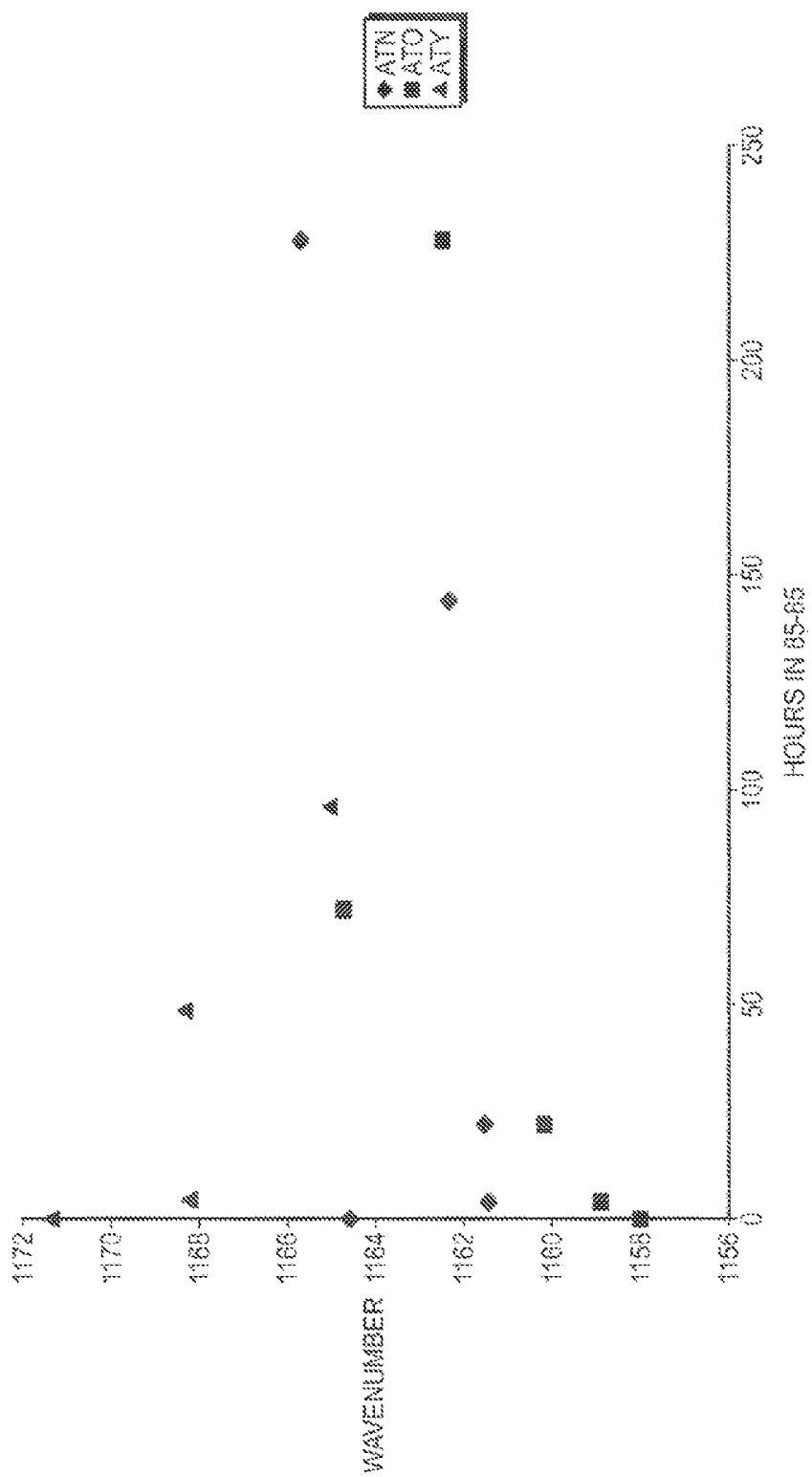
FIG. 5b shows peak position change upon exposure to 85-85 conditions for the two Si—O—Si vibration bands, AS1 and AS2 at 1070 $cm^{-1}$ and 1170 $cm^{-1}$.

As illustrated in FIGS. 5a and 5b, peak positions for the two Si—O—Si vibration bands, AS1 and AS2 at 1070 $cm^{-1}$ and 1170 $cm^{-1}$ show a change upon exposure to the high temperature high humidity conditions. Films ATY and ATN show minor peak shift in the 1070 $cm^{-1}$ band, but Film ATO shows a large and rapid shift. This band is attributed to the density of the Si—O network in the film, and a shift to higher wave number is associated with a reduction in density. Shifts in the band at 1170 $cm^{-1}$ are attributed to porosity in the films, with shifts to lower wave number indicating a reduction in pore volume. Film ATO shows a shift in AS2 band to larger wave number, while films ATN and ATY show slight shifts to smaller wave number.

Table 2 shows the plasma system parameters used in the deposition of the films labeled as ATO, ATN, and ATY.

Figure 6:
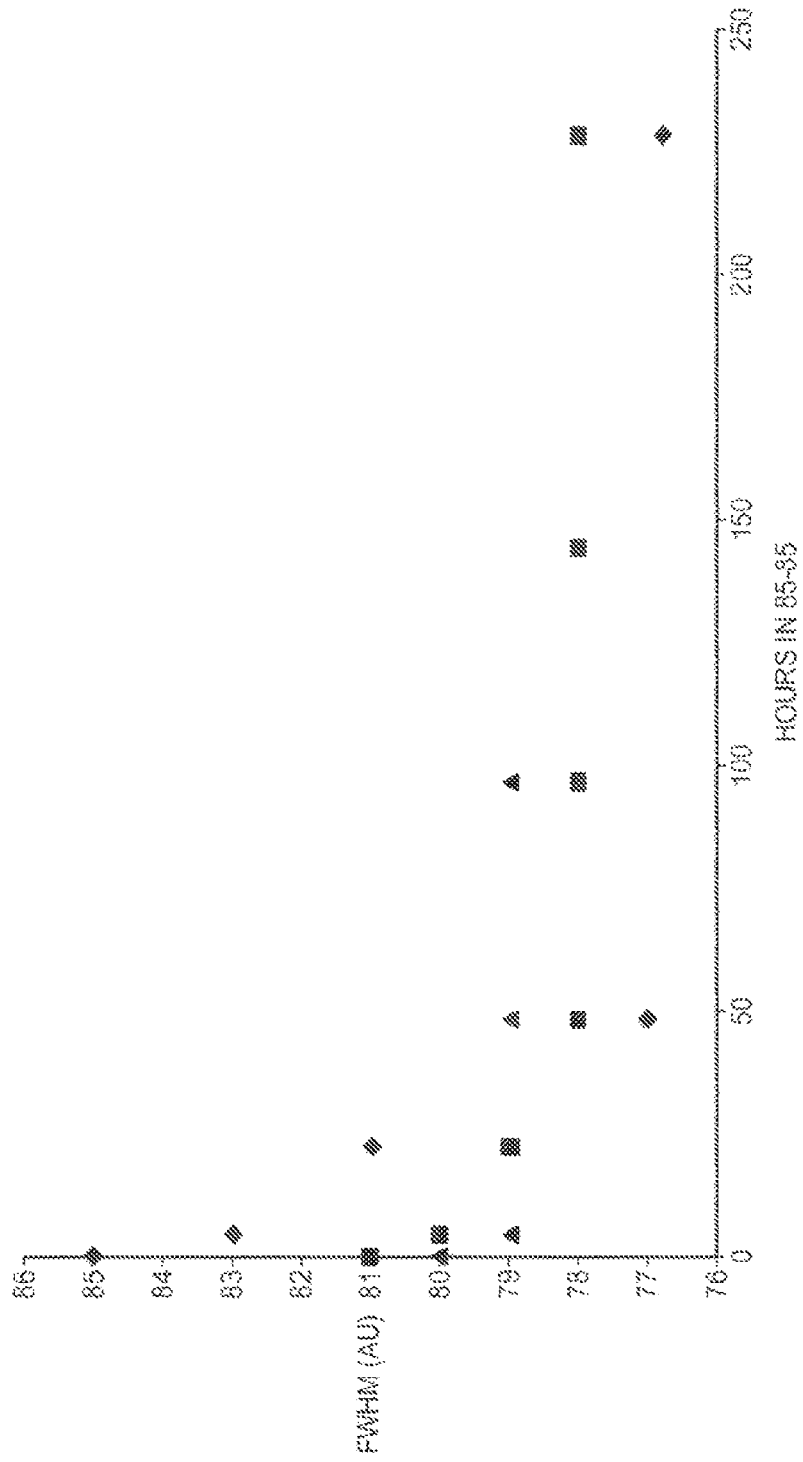
FIG. 6 shows the change in the full width at half maximum (FWHM) of the 1070 absorption band for each of exemplary barrier films in accordance with the present invention.

Referring to FIG. 6 there is shown the change in full width at half maximum (FWHM) of the 1070 $cm^{-1}$ absorption band for each of the three films. In particular, FIG. 6 shows FWHM of the band at 1070 $cm^{-1}$ as a function of time exposed to 85-85 conditions. All of the films show similar behavior, a reduction in peak width as the films are aged under the 85-85 conditions The reduction in FWHM is an indication of a reduction in disorder in the films, which is caused by the relaxation or rearrangement of the Si—O lattice in the films.

The barrier films described herein may be used for organic electronic device comprising a foundation and a functional organic body disposed over the foundation wherein a barrier film disposed over the functional organic body. In one embodiment of the device of the present invention, the device has an operating lifetime of greater than 500 hours at 85° C. and 85% relative humidity.

In some embodiments of the device of the present invention, the device includes a foundation that is a substrate. In some embodiments of the device of the present invention, further comprises a substrate, wherein the foundation is a planarizing layer on the substrate. In some embodiments where the foundation is a planarizing layer on a substrate, the planarizing layer comprises a mixture of a polymeric material and a non-polymeric material. In some embodiments of the device, the functional organic body is encapsulated by the barrier film and a planarizing layer.

In some embodiments, the device of the present invention includes a foundation that is a substrate, and the barrier layer is disposed on the substrate, followed by organic device and another barrier layer on top of the organic layer.

In some embodiments, the device of the present invention further includes a flexible foundation.

In some embodiments, the device of the present invention further includes a second barrier film disposed under the functional organic body.

The device may further comprise an edge barrier at one or more areas peripherally adjacent the functional organic body. The edge barrier may comprise end caps surrounding the edges of the functional organic body. The edge barrier may further include adhesive bonds between the barrier film and the foundation surface.

In one embodiment, at least a portion of the barrier layer extends over an edge of the functional organic body and onto the foundation.

The device may further comprise an intervening layer disposed between the surface of the foundation and the barrier layer, the intervening layer comprising a material that serves to increase the interfacial cohesion between the foundation surface and the barrier layer. In one embodiment, the intervening layer comprises an inorganic material. In one embodiment of the device of the present invention, the intervening layer is a metal including Cr, Au, Ti and combinations thereof. In one embodiment of the device of the present invention, the intervening layer is a transparent material including, a metal oxide, a metal nitride, a metal oxynitride, a metal carbide, a metal oxyboride and combinations thereof. In one such embodiment, the metal oxide includes silicon oxide, aluminum oxide, titanium oxide, indium oxide, tin oxide, zinc oxide, indium tin oxide, indium zinc oxide, aluminum zinc oxide, tantalum oxide, zirconium oxide, niobium oxide, molybdenum oxide and combinations thereof. In another such embodiment, metal nitrides include silicon nitride, titanium nitride, aluminum nitride, boron nitride and combinations thereof. In still another such

TABLE 2

| | Plasma system parameters: | | | | |
|---|---|---|---|---|---|
| Sample | Deposition Power (W) | Deposition Pressure (Pa) | Electrode Spacing (mm) | HMDSO flow (sccm) | Oxygen Flow (sccm) |
| ATO | 150 | 30 | 20 | 4.5 | 55 |
| ATN | 250 | 15 | 15.5 | 10.8 | 130 |
| ATY | 325 | 15 | 15.5 | 2.7 | 33 | embodiment, metal oxynitrides include titanium oxynitride, aluminum oxynitride, silicon oxynitride, boron oxynitride and combinations thereof. In still yet another such embodiment, metal carbides include titanium carbide tungsten carbide, boron carbide, silicon carbide and combinations thereof. In still yet another such embodiment, metal oxyborides include zirconium oxyboride, titanium oxyboride and combinations thereof.

It will be appreciated by those skilled in the art that changes could be made to the exemplary embodiments shown and described above without departing from the broad inventive concept thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and features of the disclosed embodiments may be combined. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that any methods of the present invention do not rely on the particular order of steps set forth herein, the particular order of the steps should not be construed as limitation on the claims. The claims directed to such methods should not be limited to the performance of their steps in the order written, and one skilled in the art can readily appreciate that the steps may be varied and still remain within the spirit and scope of the present invention.

All references, including publications, patent applications, and patents, cited herein are hereby incorporated by reference to the same extent as if each reference were individually and specifically indicated to be incorporated by reference and were set forth in its entirety herein.

We claim:

1. A barrier film on an organic electronic device, said barrier film comprising: an inorganic polymeric silicon composition having Si—O—Si bonds which exhibit an asymmetric stretching Si—O vibration frequency (AS1) ranging between 1200 $cm^{-1}$ and 1000 $cm^{-1}$, Si—O—H vibration frequency ranging between 950 $cm^{-1}$ and 810 $cm^{-1}$ and an —O—H vibration frequency ranging between 3400 $cm^{-1}$ and 3700 $cm^{-1}$,
   wherein the ratio of peak areas for Si—O—H and —O—H vibration frequencies compared to the peak area of the Si—O—Si vibration frequency is less than 0.15 and,
   wherein the barrier film exhibits a water vapor transmission rate between $1\times10^{-2}$ g/$m^{-2}$ day and $1\times10^{-8}$ g/$m^{-2}$ day.

2. The barrier film of claim 1, wherein the peak area of the Si—O—H vibration frequency ranging between 950 $cm^{-1}$ and 810 $cm^{-1}$ remains substantially constant following exposure to 85° C. and 85% relative humidity for up to 500 hours.

3. The barrier film of claim 2, wherein the barrier film exhibits a stress value which remains substantially constant following exposure to 85° C. and 85% relative humidity for up to 500 hours.

4. The barrier film according to claim 1, wherein the barrier film has a thickness of 0.1 to 10 micron.

5. The barrier film according to claim 1, wherein the inorganic polymeric silicon composition is formed by plasma chemical vapor deposition.

6. An organic electronic device comprising:
   a foundation;
   a functional organic body disposed over the foundation; and
   a barrier film disposed over the functional organic body, said barrier film comprising:
      an inorganic polymeric silicon composition having Si—O—Si bonds which exhibit an AS1 Si—O vibration frequency ranging between 1200 $cm^{-1}$ and 1000 $cm^{-1}$, Si—O—H vibration frequency ranging between 950 $cm^{-1}$ and 810 $cm^{-1}$ and an —O—H vibration frequency ranging between 3400 $cm^{-1}$ and 3700 $cm^{-1}$,
      wherein the ratio of peak areas for the Si—O—H and —O—H vibration frequencies compared to the peak area of the Si—O—Si vibration frequency is less than 0.15 and,
   wherein the barrier film exhibits a water vapor transmission rate between $1\times10^{-2}$ g/$m^{-2}$ day and $1\times10^{-8}$ g/$m^{-2}$ day.

7. The organic electronic device of claim 6, wherein the device has an operating lifetime of greater than 500 hours at 85° C. and 85% relative humidity.

8. The organic electronic device according to claim 6, wherein the peak area of the O—H vibration frequency at about 950 $cm^{-1}$ and 810 $cm^{-1}$ remains substantially constant following exposure to 85° C. and 85% relative humidity for 500 hours.

9. The organic electronic device according to claim 6, wherein the barrier film exhibits a stress value which remains substantially constant following exposure to 85° C. and 85% relative humidity for 500 hours.

10. The organic electronic device according to claim 6, wherein the barrier film has a thickness of 0.1 to 10 micron.

11. The organic electronic device according to claim 6, wherein the inorganic polymeric silicon composition is formed by plasma chemical vapor deposition.

12. The organic electronic device according to claim 6, wherein at least a portion of the barrier film extends over an edge of the functional organic body and onto the foundation.

13. The organic electronic device of claim 12, further comprising an intervening layer disposed between the surface of the foundation and the barrier film, the intervening layer comprising a material that serves to increase the interfacial cohesion between the foundation surface and the barrier film.

14. The device according to claim 6, further comprising an edge barrier at one or more areas peripherally adjacent the functional organic body.

15. The device of claim 14, wherein the edge barrier comprises end caps surrounding the edges of the functional organic body.

16. The device of claim 14, wherein the edge barrier comprises adhesive bonds between the barrier film and the foundation surface.

17. The device according to claim 6, further comprising a substrate, wherein the foundation is a planarizing layer on the substrate.

18. The device of claim 17, wherein the planarizing layer comprises a mixture of a polymeric material and a non-polymeric material.

19. The device of claim 17, wherein the functional organic body is encapsulated by the barrier film and the planarizing layer.

20. The device of claim 6, further comprising a second barrier film disposed under the functional organic body, said second barrier layer comprising: an inorganic polymeric silicon composition having Si—O—Si bonds which exhibit an AS1 Si—O vibration frequency ranging between $-1200$ $cm^{-1}$ and $1000$ $cm^{-1}$, Si—O—H vibration frequency ranging between $950$ $cm^{-1}$ and $810$ $cm^{-1}$ and an —O—H vibration frequency ranging between $3400$ $cm^{-1}$ and $3700$ $cm^{-1}$, wherein the ratio of peak areas for the Si—O—H and —O—H vibration frequencies compared to the peak area of the Si—O—Si vibration frequency is less than 0.15 and, wherein the second barrier film exhibits a water vapor transmission rate between $1\times10^{-2}$ $g/m^{-2}$ day and $1\times10^{-8}$ $g/m^{-2}$ day.

* * * * *